US012795913B2

(12) United States Patent
Arrazat et al.

(10) Patent No.: US 12,795,913 B2
(45) Date of Patent: Nov. 10, 2026

(54) ELECTRONIC CIRCUIT COMPRISING A TRANSISTOR CELL

(71) Applicant: STMicroelectronics International N.V., Geneva (CH)

(72) Inventors: Brice Arrazat, Bouc-bel-air (FR); Christian Rivero, Rousset (FR); Julien Delalleau, Rousset (FR); Joel Metz, Gardanne (FR)

(73) Assignee: STMicroelectronics International N.V., Geneva (CH)

( * ) Notice: Subject to any disclaimer, the term of this patent is extended or adjusted under 35 U.S.C. 154(b) by 368 days.

(21) Appl. No.: 18/540,482

(22) Filed: Dec. 14, 2023

(65) Prior Publication Data

US 2024/0215233 A1 Jun. 27, 2024

(30) Foreign Application Priority Data

Dec. 21, 2022 (FR) ....................................... 2214170

(51) Int. Cl.

| | |
|---|---|
| ***H10B 41/35*** | (2023.01) |
| ***H10B 41/10*** | (2023.01) |
| ***H10W 10/00*** | (2026.01) |
| ***H10W 10/17*** | (2026.01) |

(52) U.S. Cl.

CPC ............. *H10B 41/35* (2023.02); *H10B 41/10* (2023.02); *H10W 10/014* (2026.01); *H10W 10/17* (2026.01)

(58) Field of Classification Search

CPC ........ H10B 41/35; H10B 41/10; H10B 69/00; H10B 41/43; H10B 41/00–70; H10W 10/17; H10W 10/0143; H10W 10/0145; H10W 10/014–0148; H10D 84/0151; H10D 84/83125; G11C 16/0408–0458; G11C 2216/06–10

See application file for complete search history.

(56) References Cited

U.S. PATENT DOCUMENTS

| | | | | |
|---|---|---|---|---|
| 7,858,490 B2 * | 12/2010 | Mitsuhira | .............. | H10B 41/40 257/E21.546 |
| 10,460,982 B1 | 10/2019 | Li et al. | | |
| 2013/0119506 A1 | 5/2013 | Hokazono | | |
| 2025/0087551 A1 * | 3/2025 | Liaw | .................... | H10D 84/853 |

FOREIGN PATENT DOCUMENTS

| | | |
|---|---|---|
| FR | 3098984 A1 | 1/2022 |

OTHER PUBLICATIONS

INPI Search Report and Written Opinion for priority application, FR 2214170, report dated Jul. 13, 2023, 8 pgs.

* cited by examiner

*Primary Examiner* — Shahed Ahmed

(74) *Attorney, Agent, or Firm* — Crowe & Dunlevy LLC

(57) ABSTRACT

An electronic circuit includes a transistor cell with multiple transistors arranged inside and on top of a semiconductor substrate. Each transistor has an active area. First insulating regions are at least partially located around the transistors and extend down to a first depth in the semiconductor substrate. Second insulating regions are positioned to insulate the active areas the transistors from one another. The second insulating regions extend down to a second depth in the semiconductor substrate, the second depth being greater than the first depth.

20 Claims, 6 Drawing Sheets

ELECTRONIC CIRCUIT COMPRISING A TRANSISTOR CELL

PRIORITY CLAIM

This application claims the priority benefit of French Application for Patent No. 2214170, filed on Dec. 21, 2022, the content of which is hereby incorporated by reference in its entirety to the maximum extent allowable by law.

TECHNICAL FIELD

The present disclosure generally concerns electronic circuits, and in particular electronic circuits comprising one or a plurality of cells of transistors, such as metal oxide semiconductor field-effect transistors, or MOSFETs.

BACKGROUND

An EEPROM memory is typically formed of a memory plane organized in rows and in columns of memory words, each memory word comprising memory cells.

An EEPROM memory further generally comprises driver circuits configured to perform operations, for example, writing and/or reading, in the memory cells of the memory plane.

An EEPROM memory cell typically comprises a transistor cell including a state transistor comprising a floating gate topped with a control gate, and a selection transistor series-connected with the state transistor to be able to transmit a voltage thereto, for example to transmit a voltage to the drain region of said state transistor.

An EEPROM memory further generally comprises circuits for switching the control gates of the state transistors. A switching circuit generally comprises one or a plurality of cells of switching transistors. A switching transistor is configured to transmit a voltage to the control gate of the state transistor of a memory cell, and may be designated with the term "CG Switch", for "control gate switch". For example, a switching circuit is provided for each memory word. The switching circuits may be integrated in the memory plane, for example between memory words.

Currently, an operation for writing into a memory cell comprises an erasing followed by a programming. During the erasing, a positive high erase voltage is applied to the control gate of the state transistor and a substantially zero voltage is applied to the drain region of the state transistor, to inject by Fowler-Nordheim effect an electron charge from the drain region towards the floating gate. The source region of the state transistor is, for example, grounded. During the programming, a positive high programming voltage is applied to the drain region of the state transistor, for example through the selection transistor, and a substantially zero voltage is applied to the control gate, to extract by Fowler-Nordheim effect the electron charge potentially stored in the floating gate.

The high programming voltage applied to the drain region via the selection transistor, and/or the high erase voltage applied to the control gate via the switching transistor, is, for example, in the range from approximately 10 to 20 V, for example in the order of 13 V, or in the order of 15 V. Thus, the switching transistor and the selection transistor must be sufficiently robust to transmit this high voltage, which may be a cause of the bulkiness of memory cells and/or of switching circuits.

Now, there is desire in the field of EEPROM memories to decrease the surface area of memory cells. However, there generally exists a limit in the decrease of the surface area of memory cells, in particular in the decrease of the surface areas of the transistors of the memory cells, especially with the high applied voltages.

In EEPROM memories, smaller memory cells, comprising for example more compact high-voltage transistors, may make the driver circuits, in particular the switching circuits, more complex, and increase their surface areas, which may cancel the benefit of the size decrease of memory cells. For example, so-called shared voltage techniques, using a combination of positive and negative potentials to generate programming voltages, allow a narrowing of the memory cells to the detriment of more complex switching circuits, of inverter type, accordingly requiring wells with complementary dopings, which increases the surface area occupied by these circuits.

There accordingly exists a need in the art to overcome the excess cost in terms of surface area to obtain a real advantage in terms of decrease of the general size and of the cost of EEPROM memories, and this, without degrading other performances.

More generally, there exists a need in the art to decrease the surface area of transistor cells, in particular for transistor cells intended to operate at high voltages.

SUMMARY

Embodiments of the present description particularly concern transistor cells having at least certain transistors adapted to operating at a high voltage, typically higher than or equal to 10 volts, or even higher than or equal to 15 volts, and having at least certain high-voltage transistors that may be positioned at a short distance from each other, typically smaller than 1 μm.

Embodiments of the present description also concern non-volatile memories ("NVM"), such as electrically erasable and programmable read-only memories, known under acronym "EEPROM", comprising a plurality of transistor cells, for example formed on an integrated circuit.

An embodiment overcomes all or part of the disadvantages of known transistor cells.

An embodiment provides an electronic circuit comprising at least one transistor cell, each transistor cell comprising: a plurality of transistors arranged inside and on top of a semiconductor substrate, each transistor comprising an active area; first insulating regions at least partially located around the transistors and extending down to a first depth in the semiconductor substrate; second insulating regions positioned to insulate from one another the active areas of all or part of the transistors of the plurality of transistors, the second insulating regions extending down to a second depth in the semiconductor substrate, the second depth being greater than the first depth.

According to an embodiment, each transistor cell comprises first transistors among the plurality of transistors having active areas separated by a first distance and insulated from one another by at least one of the first insulating regions, and second transistors among the plurality of transistors having active areas separated by a second distance shorter than the first distance and insulated from one another by at least one of the second insulating regions.

According to an embodiment, the first distance is greater than or equal to 400 nm and/or the second distance is shorter than 350 nm.

According to an embodiment, the first insulating regions are first insulating trenches, for example shallow insulating trenches, and the second insulating regions are second insulating trenches, for example deep trench insulations.

According to an embodiment, the second insulating regions extend along a first direction substantially parallel to the longitudinal direction of the active areas.

According to an embodiment, the electronic circuit further comprises third insulating regions positioned to insulate the active areas of the plurality of transistors from other transistor cells, the third insulating regions extending down to a third depth in the semiconductor substrate, the third depth being greater than the first depth, for example substantially equal to the second depth, the third insulating regions being, for example, deep trench insulations.

According to an embodiment, the third insulating regions extend along a second direction substantially parallel to the transverse direction of the active areas.

According to an embodiment, at least some among the first and second insulating regions surround the active areas of all or part of the transistors of the plurality of transistors.

According to an embodiment, the transistors of the plurality of transistors are intended to operate at voltages greater than or equal to 10 volts, for example greater than or equal to 15 volts.

According to an embodiment, the transistor cell further comprises a gate structure, for example of floating-gate type, extending above the active areas of the plurality of transistors, between a source region and a drain region of each active area.

According to an embodiment, the transistors of the plurality of transistors are P-channel MOS transistors and/or N-channel MOS transistors.

According to an embodiment, the electronic circuit is contained in a non-volatile memory, for example an electrically erasable and programmable non-volatile memory.

According to an embodiment, the transistors of the plurality of transistors form switching transistors of a switching circuit coupled to memory cells of a non-volatile memory, for example of an electrically erasable and programmable non-volatile memory.

An embodiment provides a method of manufacturing an electronic circuit comprising at least one transistor cell, each transistor cell comprising a plurality of transistors formed inside and on top of a semiconductor substrate, each transistor comprising an active area, the method comprising: the forming of first insulating regions at least partially located around the transistors and extending down to a first depth in the semiconductor substrate; and the forming of second insulating regions positioned to insulate from one another the active areas of all or part of the transistors of the plurality of transistors, the second insulating regions extending down to a second depth in the semiconductor substrate, the second depth being greater than the first depth.

According to an embodiment, the method further comprises: the forming of third insulating regions positioned to insulate the active areas of the plurality of transistors from other transistor cells, the third insulating regions extending down to a third depth in the semiconductor substrate, the third depth being greater than the first depth, for example substantially equal to the second depth.

The following embodiments may apply to an electronic circuit or to a manufacturing method.

According to an embodiment, the first depth is in the range from 250 to 450 nm, for example from 300 to 400 nm, and the difference between the third depth and the first depth is greater than or equal to 100 nm, for example in the range from 100 to 200 nm.

According to an embodiment, the first depth is in the range from 250 to 450 nm, for example from 300 to 400 nm, and the difference between the second depth and the first depth is greater than or equal to 100 nm, for example in the range from 100 to 200 nm.

An embodiment provides an integrated circuit comprising any of the previously-described electronic circuits.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION

Figure 1:
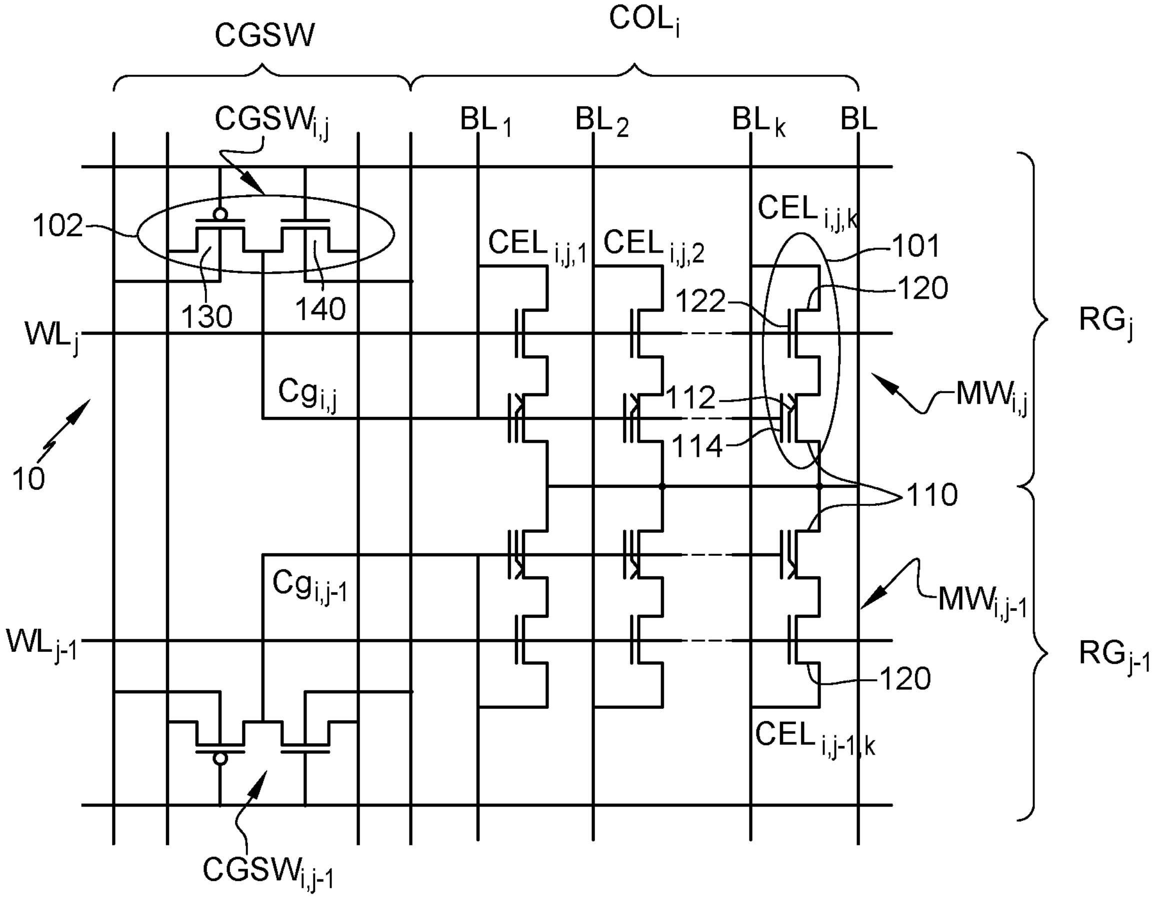
FIG. 1 is a simplified electric diagram showing a detail of a memory plane of an EEPROM memory.

Like features have been designated by like references in the various figures. In particular, the structural and/or functional features that are common among the various embodiments may have the same references and may dispose identical structural, dimensional and material properties.

For the sake of clarity, only the steps and elements that are useful for the understanding of the described embodiments have been illustrated and described in detail. In particular, the steps of manufacturing the transistor cells have not been described, being implementable with usual methods of microelectronics. Similarly, not all the details of the transistor cells, of the transistors, as well as of the memories, have been described, being within the abilities of those skilled in the art in the field of microelectronics. Further, the possible applications of the described electronic circuits have not all been given.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred, unless specified otherwise, to the orientation of the drawings.

Unless specified otherwise, the expressions "about", "approximately", "substantially", and "in the order of" signify plus or minus 10%, preferably of plus or minus 5%.

When reference is made to an "active area", it is referred to a semiconductor area of a transistor, for example delimited by insulating regions. An active area typically comprises a source region, a drain region, and a channel-forming region, or channel region, between the source region and the drain region. The active area may be formed in a semiconductor substrate or in a well formed in a semiconductor substrate.

When reference is made to a "transistor cell", it is referred to an assembly of a plurality of transistors formed inside and on top of a same semiconductor substrate.

In the following description, a length (for example of a transistor cell, of a transistor, or of an active area of a transistor) corresponds to a dimension in a first direction, corresponding to the X direction indicated in the drawings, of a main plane XY. The main plane generally corresponds to the main plane of a semiconductor substrate having the transistor formed inside and on top thereof. The first direction is parallel to the conduction direction of the transistor. Thus, a channel length of the transistor substantially corresponds to the distance between a source region and a drain region of the transistor. A width (for example of a transistor cell, of a transistor, or of an active area of a transistor) corresponds to a dimension in a second direction of the main plane, orthogonal to the X direction, corresponding to the Y direction indicated in the drawings. A thickness or a depth correspond to a dimension in the direction perpendicular to the main plane, for example a vertical direction, corresponding to the Z direction indicated in the drawings. The term "longitudinal" or "lateral" refers to the transistor length direction (X direction), and the term "transverse" refers to the transistor width direction (Y direction).

In the following description, a MOSFET may be designated under the term MOS transistor. A NMOS transistor is an N-channel MOS transistor, that is, a transistor having N-type doped source and drain regions. A PMOS transistor is a P-channel MOS transistor, that is, a transistor having P-type doped source and drain regions.

FIG. 1 is a simplified electric diagram showing a detail of a memory plane 10 of an EEPROM memory.

FIG. 1 shows an intersection between a column $COL_i$ and two rows $RG_j$, $RG_{j-1}$ of memory plane 10. In the following, the indexes "i" in the references will indicate the belonging to the respective column $COL_i$, and the indexes "j" in the references will indicate the belonging to the respective row $RG_j$.

A memory word $MW_{i,j}$, $MW_{i,j-1}$ is located at the intersection of a column $COL_i$ and of a row $RG_j$, $RG_{j-1}$.

Each memory word $MW_{i,j}$ comprises a plurality of memory cells 101 ($CEL_{i,j,1}$, $CEL_{i,j,1}$, . . . , $CEL_{i,j,k}$), each comprising a state transistor 110 and a selection transistor 120.

State transistor 110 is configured to store a binary data element and comprises for this purpose a gate structure comprising a floating gate 112 topped with a control gate 114, the gate structure being between a source region and a drain region of the state transistor. Selection transistor 120 comprises a gate structure 122 between a source region and a drain region.

The state and selection transistors are, for example, NMOS-type transistors.

Each memory cell $CEL_{i,j,k}$ is coupled to a dedicated and individual bit line $BL_k$. For example, the bit line extends in the column direction of the memory plane.

Each memory cell $CEL_{i,j,k}$ is coupled to a word line $WL_j$ which may be common for all the cells of a same row $RG_j$. For example, the word line extends in the row direction of the memory plane.

The memory cells $CEL_{i,j,k}$ of a same memory word $MW_{i,j}$ may be coupled to a same source line SL, which may be common to other memory words.

The state transistor 110 and the selection transistor 120 of a memory cell 101 are series-connected, the drain region of state transistor 110 being, for example, coupled to the source region of selection transistor 120. For example, the drain region of selection transistor 120 is coupled to the bit line $BL_k$ of memory cell $CEL_{i,j,k}$, while the source region of state transistor 110 is coupled to source line SL, and the gate structure 122 of selection transistor 120 is coupled to the word line $WL_j$ of its row $RG_j$.

The memory cells $CEL_{i,j,k}$, $CEL_{i,j-1,k}$ of a same memory word $MW_{i,j}$, $MW_{i,j-1}$ are coupled to a common control gate line $CG_{i,j}$, $CG_{i,j-1}$, configured to send a signal to the control gates 114 of the state transistors 110 of these memory cells. For example, each control gate line $CG_{i,j}$ is exclusively dedicated to a memory word $MW_{i,j}$ of a column $COL_i$ and of a row $RG_j$.

The access to control gate line $CG_{i,j}$ in memory plane 10 occurs by use of a control gate switching circuit 102 ($CGSW_{i,j}$) located in a region CGSW of memory plane 10, preferably close to the associated memory word $MW_{i,j}$. For example, control gate line $CG_{i,j}$ conveys a signal originating from switching circuit 102 to the control gates 114 of the state transistors 110 of the memory cells 101 of the associated memory word $MW_{i,j}$.

Each switching circuit 102 may comprise one (or a plurality of) inverter circuit(s), each comprising a PMOS transistor 130 in series with an NMOS transistor 140, controlled by a control signal on their gates.

Figure 2:
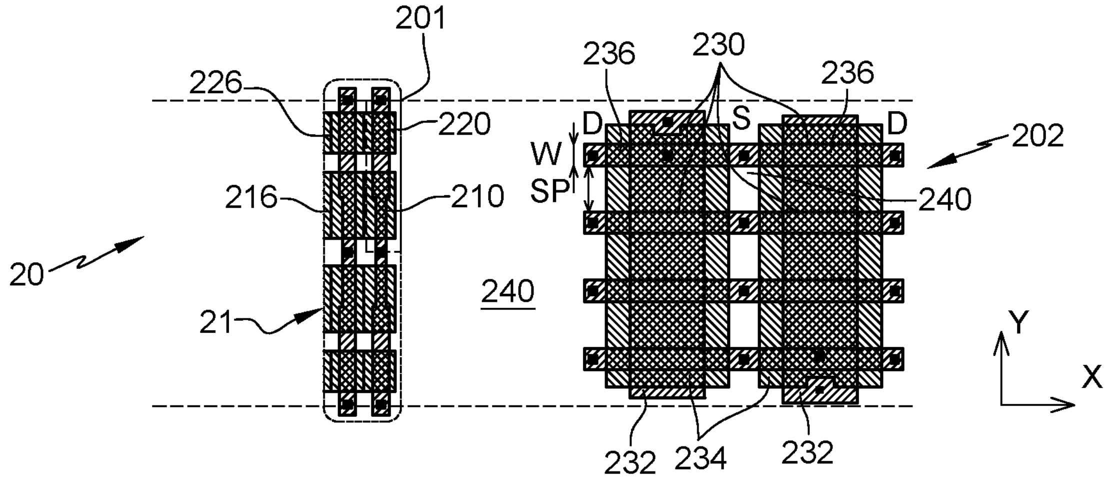
FIG. 2 shows, in a top view, a detail of a memory plane of an EEPROM memory.

FIG. 2 shows, in a top view, a detail of a memory plane 20 of an EEPROM memory.

For example, the shown X direction corresponds to the row direction of the memory plane, and the shown Y direction corresponds to the column direction of the memory plane.

FIG. 2 shows a detail of memory plane 20, this detail enabling to schematically visualize a memory word 21, comprising four memory cells 201, associated with a control gate switching circuit 202. Each memory cell 201 comprises a state transistor 210 having an active area 216 that can be continuous with the active areas of other state transistors in the X direction, in series with a selection transistor 220 having an active area 226 that can be continuous with the active areas of other selection transistors in the X direction.

There have been shown in switching circuit 202 a plurality of switching transistors 230 organized in columns, each column comprising a plurality of switching transistors, for example PMOS-type transistors, that is, MOSFET transistors having P-type doped source and drain regions. Each column of switching circuit 202 comprises a gate structure comprising a first gate 232 topped with a second gate 234, for example longer (in the X direction) and narrower (in the Y direction) than first gate 232. The first and second gates are preferably connected to each other. Gate structure 232, 234 is common to the transistors of a same column, and delimits a drain region D and a source region S in an active area 236 of each transistor 230 in the column.

A switching transistor 230 is insulated from the other switching transistors and from memory cell 201 by shallow insulating regions 240, for example shallow trench insulations, or "STI".

Although this is not shown, the switching circuit may comprise NMOS-type transistors in series with PMOS-type transistors, to form inverter circuits.

A switching transistor 230 (or an inverter circuit) is, for example, dedicated to one or a plurality of cells 201 of the memory plane 20, or to one or a plurality of cells of other memory planes (not shown in FIG. 2). It would be possible for memory word 21 to comprise less, or more, than four memory cells 201, for example six or eight memory cells 201.

Figure 3A:
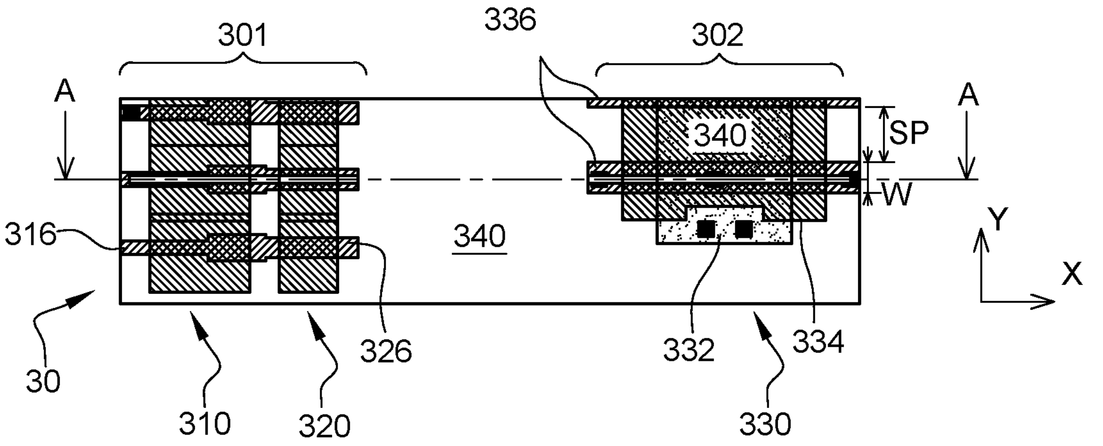
FIG. 3A shows, in a top view, an electronic circuit comprising a cell of switching transistors coupled with memory cells, corresponding to a portion of a memory plane of an EEPROM memory.
Figure 3B:
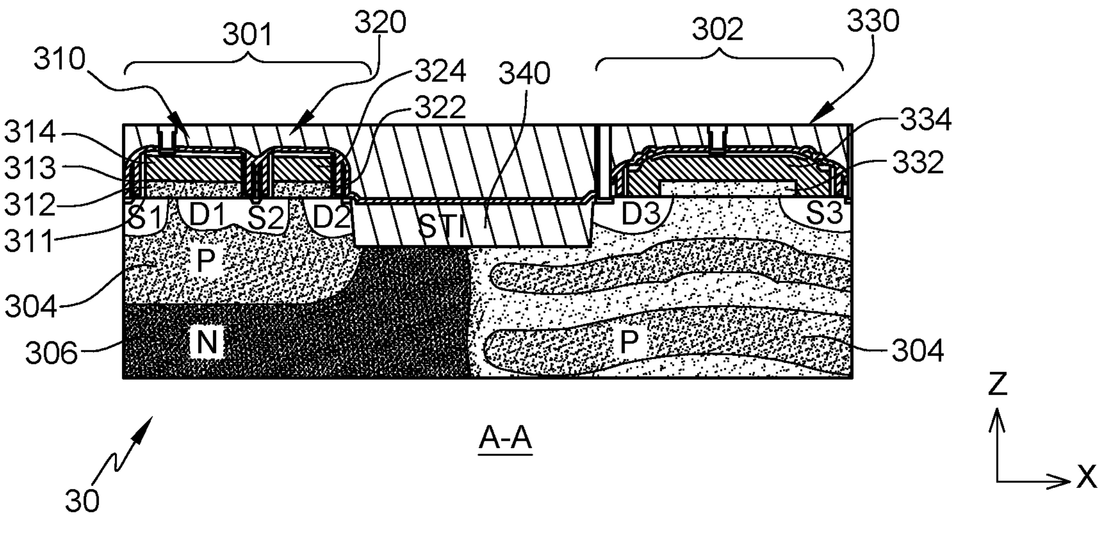
FIG. 3B shows, in a cross-section view, the electronic circuit of FIG. 3A.

FIG. 3A shows in a top view, an electronic circuit 30 comprising a cell of switching transistors coupled with memory cells, corresponding to a portion of a memory plane of an EEPROM memory. FIG. 3B shows, in a cross-section view along plane AA, the electronic circuit of FIG. 3A.

The memory plane of FIGS. 3A and 3B is, for example, similar to the memory plane 20 of FIG. 2, in more detailed fashion. There have been shown three memory cells, a switching transistor and partially another switching transistor, although the switching circuit comprises more than two switching transistors, and the memory plane comprises more than three memory cells.

Each memory cell 301 comprises a state transistor 310 and a selection transistor 320 in series with the state transistor. The state and selection transistors are, for example, NMOS-type transistors, that is, MOS transistors having N-type doped source and drain regions. State 310 and selection 320 transistors are formed inside and on top of a semiconductor substrate 304, for example of type P, with a deep well 306, for example of type N, formed in the semiconductor substrate, under each memory cell 301 and between each memory cell 301 and the switching transistor 330 described hereafter.

State transistor 310 comprises an active area 316 formed in semiconductor substrate 304 as well as a gate structure topping active area 316 and comprising a floating gate 312 topped with a control gate 314, gate structure 312, 314 being between a first source region S1 and a first drain region D1 of active area 316. This gate structure is common to a plurality of state transistors in the Y direction.

Floating gate 312 is, for example, electrically insulated from control gate 314 by an inter-gate dielectric layer 313, and from semiconductor substrate 304 by a dielectric layer 311, for example made of silicon dioxide ($SiO_2$). Control gate 314 is, for example, coupled with the switching transistor 330 described hereafter.

Selection transistor 320 comprises an active area 326 formed in semiconductor substrate 304, as well as a gate structure 322, 324 topping active area 326, gate structure 322, 324 being between a second source region S2 and a second drain region D2 of active area 326. This gate structure is common to a plurality of selection transistors in the Y direction.

For example, for reasons of simplification of the memory cell manufacturing method, the gate structure of the selection transistor may be of floating-gate type, as shown in FIG. 3B, the two gates being connected together to form a single gate.

The first drain region D1 of state transistor 310 is coupled to the second source region S2 of selection transistor 320.

In the example shown in FIGS. 3A and 3B, each switching transistor 330 is positioned on the same semiconductor substrate 304 as the state transistor 310 and the selection transistor 320 of each memory cell 301. Conversely to memory cell 301, there is no deep well formed in the semiconductor substrate under switching transistor 330.

The shown switching transistor 330 is an NMOS-type transistor, that is, a transistor having N-type doped source and drain regions.

Switching transistor 330 comprises an active area 336 formed in semiconductor substrate 304 as well as a gate structure 332, 334, similar to the gate structure 232, 234 of FIG. 2, topping active area 336, gate structure 332, 334 being between a third source region S3 and a third drain region D3 of active area 336. This gate structure is common to a plurality of switching transistors in the Y direction.

For example, for reasons of simplification of the manufacturing method, the gate structure of the switching transistor may be of floating-gate type, as shown in FIG. 3B, the two gates being connected together to form a single gate.

Switching transistor 330 is insulated from the other switching transistors of switching circuit 302 and from memory cells 301 by shallow insulating regions 340, for example STIs. Memory cells 301 are also insulated from one another by shallow insulating regions 340, for example STIs.

As can be observed with the previously-described drawings, the control gate switching circuits occupy a non-negligible surface area in a memory plane.

A way to decrease the surface area occupied by the control gate switching circuits could be to decrease the width W of the active area 236, 336 of switching transistor 230, 330, but this may have as a consequence to decrease the breakdown voltage of the transistor, which may be incompatible with the high operating voltages.

Another way could be to decrease the spacing SP between two adjacent switching transistors in the Y direction, but this may have as a consequence to increase the leakage current between transistors.

The inventors provide a transistor cell enabling to address the previously-described improvement needs, and to overcome all or part of the disadvantages of transistor cells, such as the previously-described switching transistor cells and/or memory cells. In particular, the inventors provide a transistor cell with a decreased bulkiness.

Embodiments of transistor cells will be described hereafter. The described embodiments are non-limiting and different variants will occur to those skilled in the art based on the indications of the present disclosure.

In particular, in the embodiments described hereafter, a transistor cell is contained in an EEPROM-type memory, for example in a memory plane. A transistor cell may form all or part of a switching circuit and/or of a memory cell of an EEPROM-type memory. However, this application is not limiting, and a transistor could form or be contained, for example, in a FLASH memory of flash NOR and NAND type, or in a memory of split gate type.

Figure 4A:
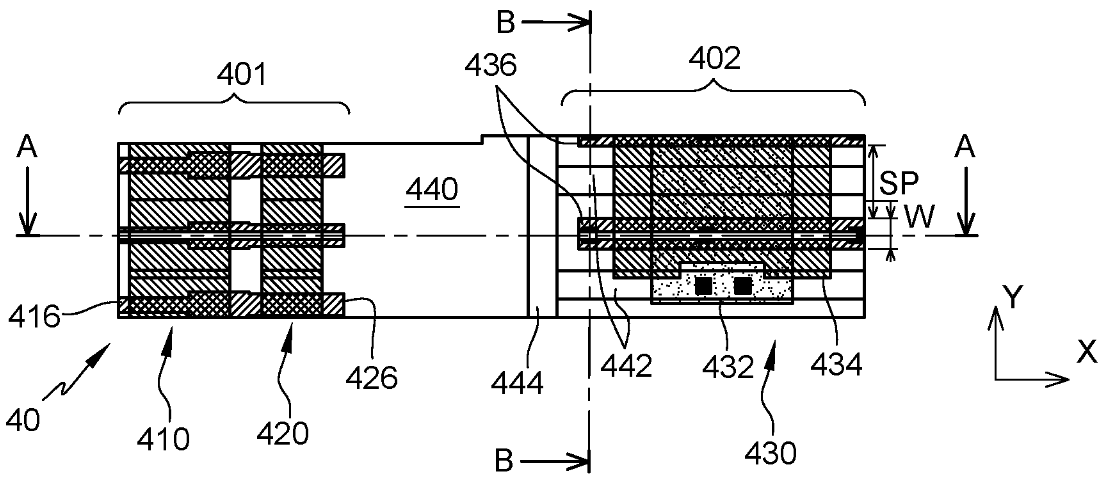
FIG. 4A shows, in a top view, an electronic circuit according to an embodiment comprising a cell of switching transistors coupled with memory cells, corresponding to a portion of a memory plane of an EEPROM memory.
Figure 4B:
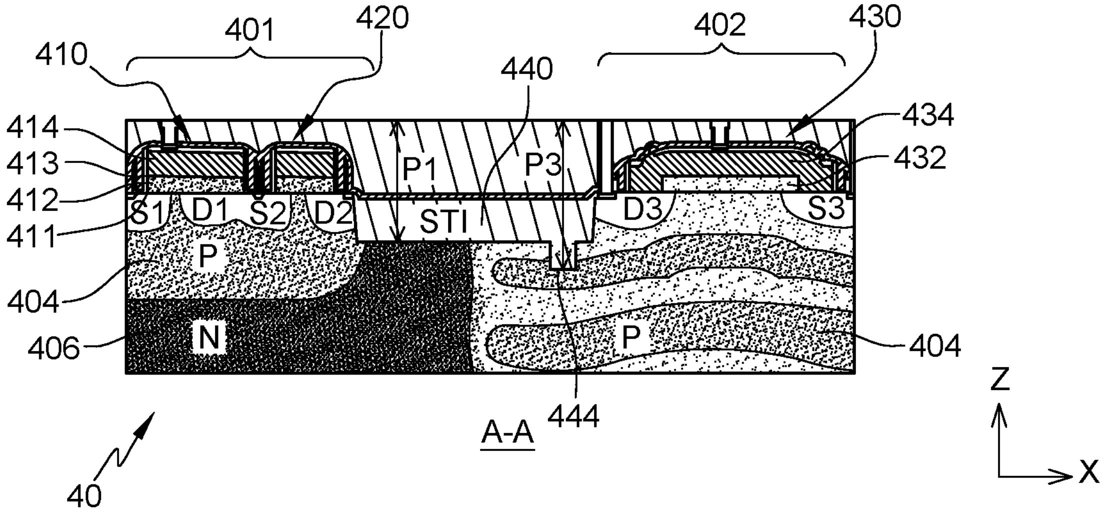
FIG. 4B shows, in a cross-section view AA, the electronic circuit of FIG. 4A.
Figure 4C:
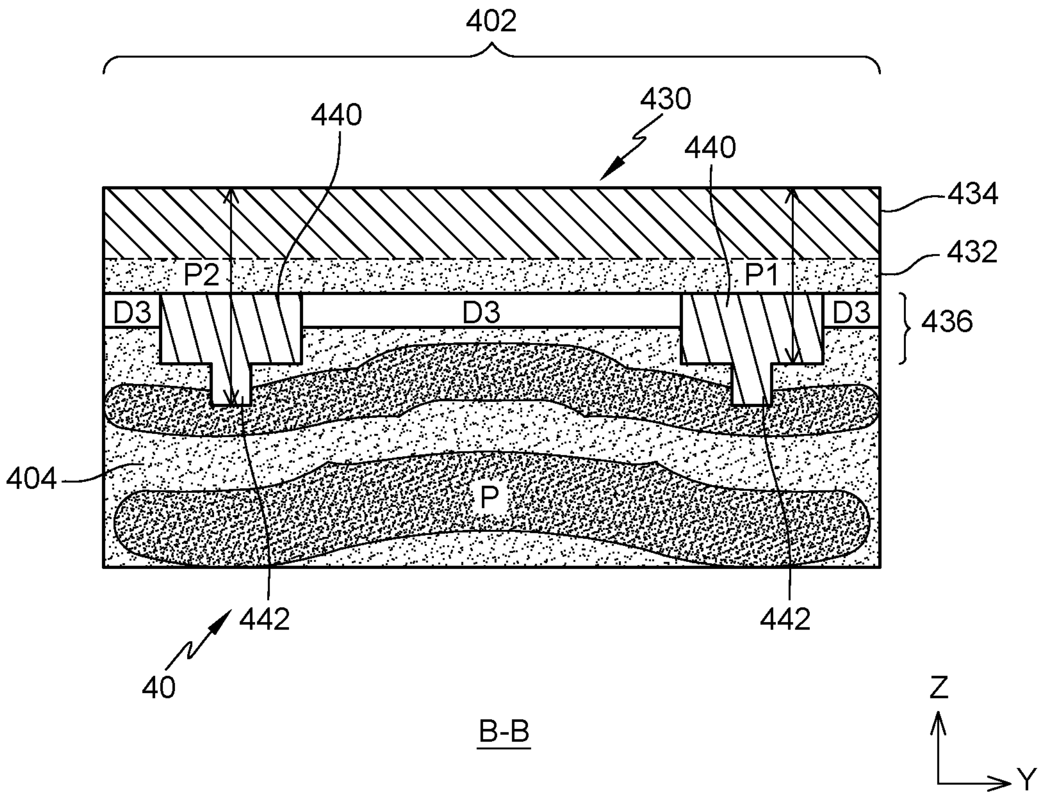
FIG. 4C shows, in a cross-section view BB, the electronic circuit de FIG. 4A.

FIG. 4A shows in a top view, an electronic circuit 40 according to an embodiment comprising a cell of switching transistors coupled with memory cells 401, corresponding to a portion of a memory plane of an EEPROM memory. FIG. 4B shows, in a cross-section view along plane AA, the electronic circuit of FIG. 4A. FIG. 4C shows, in a cross-section view along plane BB, the electronic circuit of FIG. 4A.

Similarly to FIGS. 3A and 3B, FIGS. 4A, 4B, and 4C show memory cells 401 associated with switching transistors 430 of a switching circuit 402. There have been shown, in FIGS. 4A, 4B, and 4C, three memory cells, although the memory plane comprises more than three memory cells. Switching circuit 402 comprises a plurality of switching transistors, although they are not all shown in FIGS. 4A, 4B, and 4C.

Each memory cell 401 comprises a state transistor 410 and a selection transistor 420 in series with the state transistor. The state and selection transistors are, for example, NMOS-type transistors, that is, transistors having N-type doped source and drain regions. The state and selection transistors are, for example, formed inside and on top of a semiconductor substrate 404, for example of type P. A deep well 406, for example of type N, is formed in the semiconductor substrate, under each memory cell 401 and between each memory cell 401 and the switching transistors 430 described hereafter.

State transistor 410 comprises an active area 416 formed in semiconductor substrate 404, as well as a gate structure topping active area 416 and comprising a floating gate 412 topped with a control gate 414, gate structure 412, 414 being between a first source region S1 and a first drain region D1 of the active area 416 of the state transistor. This gate structure is common to a plurality of state transistors in the Y direction. Active area 416 may be continuous with active areas of other state transistors in the X direction.

Floating gate 412 is electrically insulated from control gate 414 by an inter-gate dielectric layer 413, for example a multilayer called "ONO" for oxide-nitride-oxide, and from semiconductor substrate 404 by a dielectric layer 411, for example made of silicon dioxide ($SiO_2$). Floating gate 412 may non-volatilely store electric charges. The injection of charges into floating gate 412 is obtained by Fowler-Nordheim effect through dielectric layer 411. Control gate 414 is coupled with switching circuit 402, for example, with one of switching transistors 430.

Selection transistor 420 comprises an active area 426 formed in semiconductor substrate 404 as well as a gate structure 422, 424 topping active area 426, gate structure 422, 424 being between a second source region S2 and a second drain region D2 of active area 426. This gate structure is common to a plurality of selection transistors in the Y direction. Active area 426 may be continuous with active areas of other selection transistors in the X direction.

For example, for reasons of simplification of the memory cell manufacturing method, the gate structure of the selection transistor may be of floating-gate type, as shown in FIG. 4B, the two gates being preferably connected together to form a single gate. As a variant, the gate structure of the selection transistor may have a simple gate.

The first drain region D1 of state transistor 410 is coupled to the second source region S2 of selection transistor 420.

In the example shown in FIGS. 4A, 4B, and 4C, each switching transistor 430 is positioned on the same semiconductor substrate 404 as the state transistor 410 and the selection transistor 420 of each memory cell 401. Conversely to memory cell 401, there is no deep well formed in the semiconductor substrate under switching transistors 430.

Each switching transistor 430 is, for example, an NMOS-type transistor, that is, a transistor having N-type doped source and drain regions. As a variant, each switching transistor may be a PMOS-type transistor, that is, a transistor having P-type doped source and drain regions. Switching circuit 402 may also comprise a plurality of inverter circuits each comprising a PMOS transistor in series with an NMOS transistor.

Switching transistor 430 comprises an active area 436 formed in semiconductor substrate 404, as well as a gate structure 432, 434 topping active area 436, gate structure 432, 434 being between a third source region S3 and a third drain region D3 of active area 436. The gate structure of the switching transistor may be of floating-gate type, as shown in FIG. 4B, the two gates being preferably connected together to form a single gate. As a variant, the gate structure of the switching transistor may have a simple gate. This gate structure is common to a plurality of switching transistors in the Y direction. Active area 436 may be continuous with active areas of other switching transistors in the X direction.

In semiconductor substrate 404, are formed first insulating regions 440, which are, in the shown example, shallow insulating trenches. These first insulating regions 440 particularly enable to insulate each switching transistor 430 from other switching transistors of the switching circuit 402 as well from memory cells 401, and to insulate all or part of memory cells 401 from one another. First insulating regions 440 extend down to a first depth P1 in semiconductor substrate 404.

The memory plane 40 of FIGS. 4A, 4B, and 4C can be distinguished from the memory plane 30 of FIGS. 3A and 3B, in that, between the active areas 436 of the switching transistors 430 adjacent in the Y direction, are formed second insulating regions 442 (shown in FIGS. 4A and 4C), deeper than first insulating regions 440. In other words, second insulating regions 442 extend down to a second depth P2 in semiconductor substrate 404, second depth P2 being greater than first depth P1.

These second insulating regions 442 enable to further insulate the active areas 436 of the switching transistors 430 from one another. In the shown example, the second insulating regions 442 are deep trench insulations.

For example, first insulating regions 440 have a depth P1 in the range from 250 to 450 nm, or even from 300 to 400 nm, for example equal to approximately 400 nm, and the difference between second depth P2 and first depth P1 is greater than or equal to 100 nm, for example in the range from 100 to 200 nm. For example, the second insulating regions have a depth in the range from 500 to 600 nm.

Figure 5:
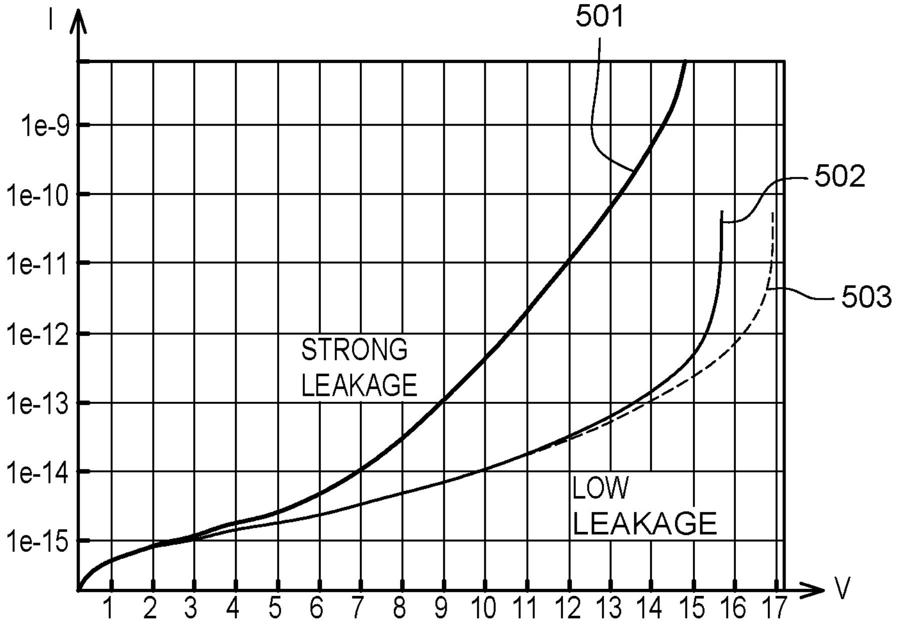
FIG. 5 illustrates curves representing a junction leakage current of a transistor according to an applied drain voltage, and this, for a plurality of examples of transistor cells.

These second insulating regions 442 enable to decrease the spacing SP between the active areas 436 of the adjacent switching transistors 430, without for all this to increase the leakage current between these transistors, and even decreasing this leakage current, as can be seen in FIG. 5 described hereafter. Indeed, the fact of having deeper insulating regions located between the active areas of the switching transistors enables to limit the passage of charge carriers from one active area to the other.

According to the distance between the active areas of adjacent transistors, and, for example, also according to the operating voltage, it may be chosen to form between said active areas either one of the first insulating regions, or one of the second insulating regions. Thus, a transistor cell may comprise at least two first adjacent transistors having active areas separated by a first distance and insulated from each other by at least one of the first insulating regions, and second adjacent transistors having active areas separated by a second distance shorter than the first distance and insulated from one another by at least one of the second insulating regions. The first distance is, for example, greater than or equal to 400 nm and the second distance is, for example, shorter than 350 nm.

The inventors have determined that the presence of the second insulating regions could enable to decrease the distance between two adjacent active areas, by up to approximately 30%, without increasing the leakage current, and could thus enable to decrease the width (dimension in the Y direction) of the switching circuit.

Further, the fact of targeting the location of these second insulating regions enables not to increase the depth of all the insulating regions, in particular of the first insulating regions, which are formed in the semiconductor substrate. For example, this enables to avoid impacting the operation of other electronic components of the electronic circuit, for example of other transistors, or even to question the entire strategy of design of an electronic circuit. Conversely, the embodiments provide locating the second insulating regions only between the active areas of the transistors, the insulation of which is desired to be reinforced, or even around these active areas.

As shown in FIGS. 4A and 4B, third insulating regions 444, also deeper than first insulating regions 440, may be formed in semiconductor substrate 404 between switching transistors 430 and memory cells 401, for example close to the active areas 436 of the switching transistors. The third insulating regions 444 extend down to a third depth P3 in semiconductor substrate 404, third depth P3 being greater than first depth P1, for example substantially equal to second depth P2. These third insulating regions 444 are not compulsory, but they can be advantageous, for example if the insulation of the switching transistors and the memory cells is desired to be reinforced, for example between the switching transistors and the selection transistors of the memory cells.

For example, first insulating regions 440 have a depth P1 in the range from 250 to 450 nm, or even from 300 to 400 nm, for example equal to approximately 400 nm, and the difference between third depth P3 and first depth P1 is greater than or equal to 100 nm, for example in the range from 100 to 200 nm. For example, the third insulating regions have a depth in the range from 500 to 600 nm.

In the shown example, third insulating regions 444 are deep trench insulations.

For example, the active areas of all or part of the switching transistors may be surrounded with second and/or third insulating regions, for example with deep trench insulations.

More generally, the active areas of all or part of the transistors of a transistor cell according to an embodiment may be partially or totally surrounded with second and/or third insulating regions.

The second insulating regions, and the third optional insulating regions, are described in relation with switching transistors forming a transistor cell, but this could apply to other transistor cells of a memory plane, for example to memory cells of the memory plane, or to a memory cells-switching circuit assembly, for example to insulate the switching transistors from the transistors of memory cells.

More widely, the presence of the second insulating regions, and optionally of the third insulating regions, between the active areas of all or part of the transistors of a transistor cell may enable to decrease the dimensions of this cell, without increasing the leakage current.

FIG. 5 illustrates curves showing a junction leakage current (leakages under STI), according to an applied drain voltage, and this, for a plurality of transistor cells. In other words, the curves show leakage current measurements between two active areas insulated by a STI, all in a semiconductor substrate, in the example a P-type substrate.

Curve 501 corresponds to cell of switching transistors spaced apart by 0.2 μm, with first insulating regions only. Curve 502 corresponds to a cell of switching transistors spaced apart by 0.5 μm, with first insulating regions only. It can be observed that the fact of decreasing the spacing SP between the active areas of transistors which are only insulated by first insulating regions increases the leakage current, whereby the operation can be a strong leakage current operation (STRONG LEAKAGE).

Curve 503 corresponds to a cell of switching transistors spaced apart by 0.2 μm, with first and second insulating regions, according to an embodiment. It can be observed that the fact of adding second insulating regions enables to decrease the leakage current, to be in a low leakage current operation (LOW LEAKAGE), even when the spacing SP between then active areas of the transistors is smaller.

FIGS. 6A to 6E show structures obtained at the end of steps of a simplified example of a method of forming insulating trenches of a transistor cell of an electronic circuit according to an embodiment.

Figure 6A:
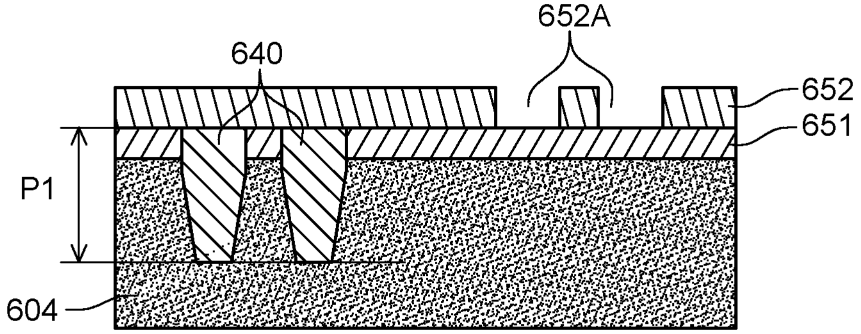
FIGS. 6A to 6E are cross-section views partially and schematically illustrating structures obtained at the end of successive steps of a simplified example of a method of manufacturing insulating trenches of a transistor cell of an electronic circuit according to an embodiment.

FIG. 6A shows an initial structure comprising first insulating trenches 640, of a first depth P1, formed in a semiconductor layer 604 (semiconductor substrate). Further, an etch stop layer 651, for example a silicon nitride layer, is positioned on semiconductor layer 604, first insulating trenches 640 crossing this etch stop layer. A resin layer 652 is positioned on etch stop layer 651, said resin layer comprising openings 652A corresponding to the positioning of the future second insulating trenches.

In FIGS. 6A to 6E, semiconductor layer 604 is, for example, a silicon layer (Si), for example a silicon layer of a stack of SOI type, for "silicon on insulator".

Figure 6B:
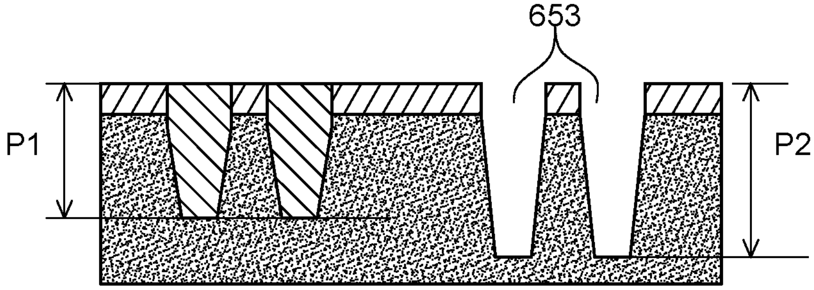

FIG. 6B shows a structure obtained at the end of the etching of semiconductor layer 604 through the openings 652A of resin layer 652, and this, down to a second depth P2, greater than first depth P1, to form second trenches 653 deeper than first insulating trenches 640.

Figure 6C:
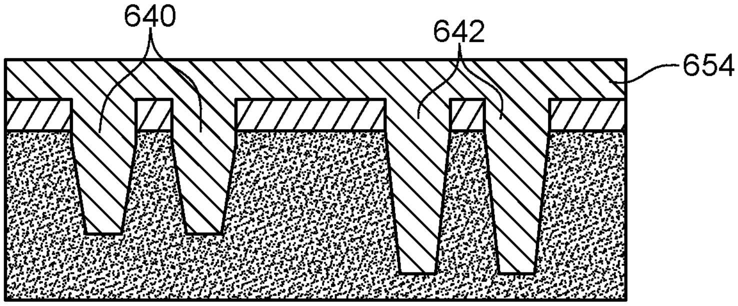

FIG. 6C shows a structure obtained after the deposition of a dielectric layer 654, for example a silicon oxide such as $SiO_2$, on the structure of FIG. 6B. The dielectric material fills second trenches 653 to form second insulating trenches 642, and further extends over semiconductor layer 604 and the insulating trenches.

Figure 6D:
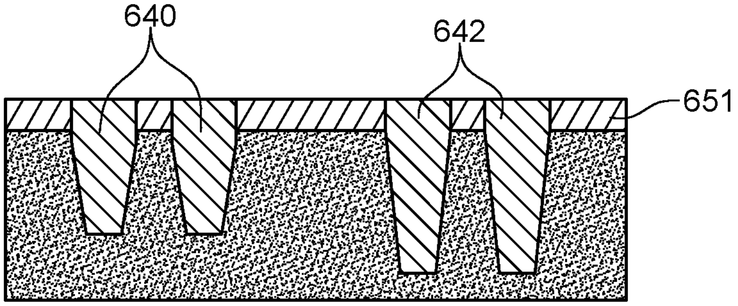

FIG. 6D shows a structure obtained after a step of planarization, for example by chemical-mechanical polishing, known under acronym "CMP", to remove the dielectric material which further extends over the semiconductor layer and the insulating trenches.

Figure 6E:
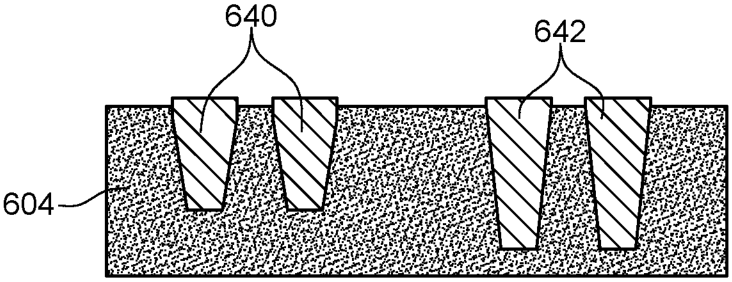

FIG. 6E shows a structure obtained after a step of removal of etch stop layer 651, for example by etching.

The manufacturing of second insulating trenches has been described, knowing that the third insulating trenches may be manufactured similarly to the second insulating trenches, by etching third trenches down to a third depth P3.

As a variant of the described example of manufacturing, the second insulating trenches, and/or the third insulating trenches, may be formed from certain first insulating trenches which will then be etched deeper.

These examples of manufacturing method shows that it is possible to form second and/or third insulating regions, for example second and/or third insulating trenches, next to the first insulating regions, for example next to the first insulating trenches, in a same semiconductor substrate.

Various embodiments and variants have been described. Those skilled in the art will understand that certain features of these various embodiments and variants may be combined, and other variants will occur to those skilled in the art.

In particular, the embodiments have been described in relation with an EEPROM memory. More generally, the embodiments may apply to electronic circuits, or integrated circuits, comprising transistor cells. In particular, the embodiments may apply to cells of transistors intended to receive a high voltage, typically higher than 10 V, for example equal to approximately 13 V, or even higher than or equal to 15 V, particularly when it desired to bring closer to each other two adjacent transistors intended to operate at these high voltages. For example, the embodiments may apply to a FLASH memory of flash NOR and NAND type, or in a memory of split gate type.

Finally, the practical implementation of the described embodiments and variants is within the abilities of those skilled in the art based on the functional indications given hereabove.

The invention claimed is:

1. An electronic circuit including at least one transistor cell, wherein said at least one transistor cell comprises:

a plurality of transistors arranged inside and on top of a semiconductor substrate, each transistor of said plurality of transistors comprising an active area in the semiconductor substrate;

first insulating regions at least partially located around each transistor of said plurality of transistors and extending down to a first depth in the semiconductor substrate;

second insulating regions positioned to insulate the active areas of the transistors of the plurality of transistors from one another, each second insulating region extending from a bottom of the first insulating region down to a second depth in the semiconductor substrate, the second depth being greater than the first depth;

wherein the plurality of transistors of said at least one transistor cell comprise first transistors having active areas separated by a first distance and insulated from one another by at least the first insulating regions, and second transistors having active areas separated by a second distance shorter than the first distance and insulated from one another by at least the second insulating regions.

2. The electronic circuit according to claim 1, wherein the first distance is greater than or equal to 400 nm and the second distance is less than or equal to 350 nm.

3. The electronic circuit according to claim 1, wherein the first insulating regions are shallow trench insulations, and the second insulating regions are deep trench insulations.

4. The electronic circuit according to claim 1, wherein the second insulating regions extend along a first direction substantially parallel to a longitudinal direction of the active areas.

5. The electronic circuit according to claim 1, further comprising third insulating regions positioned to insulate the active areas of the plurality of transistors from other transistor cells, each third insulating region extending from the bottom of the first insulating region down to a third depth in the semiconductor substrate, the third depth being greater than the first depth.

6. The electronic circuit according to claim 5, wherein the third depth is equal to the second depth.

7. The electronic circuit according to claim 5, wherein the third insulating regions are deep trench insulations.

8. The electronic circuit according to claim 5, wherein the third insulating regions extend along a second direction substantially parallel to a transverse direction of the active areas.

9. The electronic circuit according to claim 5, wherein the first depth is in a range from 250 to 450 nm, and a difference between the third depth and the first depth is greater than or equal to 100 nm.

10. The electronic circuit according to claim 1, wherein the transistors of the plurality of transistors are configured for operation at voltages greater than or equal to 10 volts.

11. The electronic circuit according to claim 1, wherein the transistor cell further comprises a gate structure of floating-gate type extending above the active areas of the plurality of transistors between a source region and a drain region of each active area.

12. The electronic circuit according to claim 1, wherein said electronic circuit is contained in an electrically erasable and programmable non-volatile memory.

13. The electronic circuit according to claim 1, wherein the transistors of the plurality of transistors form switching transistors of a switching circuit coupled to memory cells of a non-volatile memory.

14. The electronic circuit according to claim 1, wherein the first depth is in a range from 250 to 450 nm, and a difference between the second depth and the first depth is greater than or equal to 100 nm.

15. An integrated circuit comprising an electronic circuit according to claim 1.

16. A method of manufacturing an electronic circuit, comprising at least one transistor cell, each transistor cell comprising a plurality of transistors formed inside and on top of a semiconductor substrate, each transistor of said plurality of transistors comprising an active area in the semiconductor substrate, the method comprising:

forming first insulating regions at least partially located around the transistors and extending down to a first depth in the semiconductor substrate; and forming second insulating regions positioned to insulate the active areas of the transistors of the plurality of transistors from one another, each second insulating region extending down from a bottom of the first insulating region to a second depth in the semiconductor substrate, the second depth being greater than the first depth;

wherein each transistor cell comprises first transistors of the plurality of transistors having active areas separated by a first distance and insulated from one another by at least the first insulating regions, and second transistors of the plurality of transistors having active areas separated by a second distance shorter than the first distance and insulated from one another by at least the second insulating regions.

17. The manufacturing method according to claim 16, further comprising:

forming third insulating regions positioned to insulate the active areas of the plurality of transistors from other transistor cells, each third insulating region extending down from the bottom of the first insulating region to a third depth in the semiconductor substrate, the third depth being greater than the first depth.

18. The manufacturing method according to claim 17, wherein the third depth is equal to the second depth.

19. The manufacturing method according to claim 17, wherein the first depth is in a range from 250 to 450 nm, and a difference between the third depth and the first depth is greater than or equal to 100 nm.

20. The manufacturing method according to claim 16, wherein the first depth is in a range from 250 to 450 nm, and a difference between the second depth and the first depth is greater than or equal to 100 nm.

* * * * *